(12) United States Patent
Calderone et al.

(10) Patent No.: US 6,507,942 B1
(45) Date of Patent: Jan. 14, 2003

(54) METHODS AND CIRCUITS FOR TESTING A CIRCUIT FABRICATION PROCESS FOR DEVICE UNIFORMITY

(75) Inventors: Anthony P. Calderone, San Jose, CA (US); Feng Wang, San Jose, CA (US); Tho Le La, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 167 days.

(21) Appl. No.: 09/613,494

(22) Filed: Jul. 11, 2000

(51) Int. Cl.$^7$ ................................................ G06F 17/50
(52) U.S. Cl. ........................... 716/16; 716/17; 716/18
(58) Field of Search .................. 716/1–21; 714/30; 712/1, 34, 36, 37, 39, 43; 703/14, 19, 23; 375/354, 142; 369/53; 368/113; 326/40; 177/210 FP

(56) References Cited

U.S. PATENT DOCUMENTS 6,182,206 B1 * 1/2001 Baxter .......................... 712/43
6,298,453 B1 * 10/2001 Culbertson et al. ........... 714/30

OTHER PUBLICATIONS

"The Programmable Logic Data Book 1999"; available from Xilinx, Inc., 2100 Logic Drive, San Jose, CA 95124; pp. 3–3 to 3–22.

* cited by examiner

Primary Examiner—Vuthe Siek
Assistant Examiner—Naum Levin
(74) Attorney, Agent, or Firm—Arthur J. Behiel; Edel M. Young

(57) ABSTRACT

Described are systems and methods for measuring the size uniformity of circuit features defined by the critical dimension of an integrated-circuit fabrication process. An integrated circuit is configured to include a number of oscillators, each occupying a region of the integrated circuit. Each oscillator oscillates at a frequency that depends on the critical dimension of features in the region in which it is formed. Consequently, the critical dimensions of regions across the surface of the integrated circuit can be mapped and compared by comparing the oscillation frequencies of identical oscillators formed in various regions of the integrated circuit. In programmable logic devices, oscillators can be implemented using programmable logic resources. In other embodiments, small, simple oscillators can be placed at various locations on the integrated circuit.

26 Claims, 4 Drawing Sheets

US 6,507,942 B1

METHODS AND CIRCUITS FOR TESTING A CIRCUIT FABRICATION PROCESS FOR DEVICE UNIFORMITY

FIELD OF THE INVENTION

This invention relates generally to methods and circuits for measuring dimension uniformity of device features on integrated circuits.

BACKGROUND

Most integrated circuits (ICs) are built up using a number of material layers. Each layer is patterned to add or remove selected portions to form circuit features that will eventually make up a complete circuit. The patterning process, known as photolithography, defines the dimensions of the circuit features.

The minimum dimension that a given photolithography process can resolve is alternatively called the line width, the minimum feature size, or the critical dimension. The critical dimension is a very important parameter, as reductions in the critical dimension tend to improve speed performance.

FIG. 1 (prior art) is a cross-section of an MOS transistor 100 formed in the surface of a semiconductor substrate 102. Transistor 100 conventionally includes source and drain regions 105 separated by a channel region 110. A gate 115 and gate insulator 117 disposed over substrate 102 mask substrate 102 during formation of source and drain regions 105; thus, the width of gate 115 defines the channel length L. It is generally desirable that transistor channel length be as short as practical to achieve maximum transistor switching speed. Thus, the length of gate 115 is typically the critical dimension. Other device features, such as conductor widths, are also defined to be the critical dimension.

The critical dimension of device features on various regions of an integrated circuit should be similar; otherwise, different regions of the IC will exhibit different speed performance, potentially leading to timing errors and other failures. Thus, critical dimensions are routinely measured on various parts of an IC as part of a comprehensive quality-control program.

Several conventional critical dimension measuring techniques allow IC manufacturers to verify critical dimension uniformity. In typical methods, an operator measures the critical dimensions of device features in a number of regions of an IC using a secondary electron microscope (SEM). Unfortunately, critical dimension measurement must only be done at selected portions of the IC, and cannot give precise information about performance of the device. Therefore, a technique is needed to determine the full range of performance values for the IC and to point out which portions of the IC have the best and worst performance.

Programmable logic devices (PLDs) are a well-known type of IC that may be programmed by a user (e.g., a circuit designer) to perform specified logic functions. One type of PLD, the field-programmable gate array (FPGA), typically includes an array of configurable logic blocks (CLBs) that are programmably interconnected to each other and to programmable input/output blocks (IOBs). The CLBs include memory arrays that can be configured either as look-up tables (LUTs) that perform specific logic functions or as random-access memory (RAM). Some modern FPGAs also include embedded blocks of RAM optimized for memory applications. Configuration data loaded into internal configuration memory cells on the FPGA define the operation of the FPGA by determining how the CLBs, interconnections, block RAM, and IOBs are configured.

Each element in a signal path introduces some delay. In FPGAS, the many potential combinations of delay-inducing elements complicate timing issues. FPGA manufacturers would like to guarantee the highest speed performance possible without causing ICs to fail to meet the guaranteed timing specifications. Unpredictable speed variations, including those associated with non-uniform critical dimensions, necessitate the use of undesirably large guard bands to ensure correct device performance. Thus, the need for a simple, inexpensive method for measuring the critical dimension uniformity is particularly important for FPGAS.

SUMMARY

Systems and methods are described for measuring the size uniformity of circuit features defined by an integrated-circuit (IC) fabrication process. In accordance with the inventive method, an IC is configured to include a number of substantially identical oscillators, each occupying a region of the IC. Each oscillator oscillates at a frequency that depends, in part, on the critical dimensions of features in the region in which it is formed. Consequently, the critical dimensions of regions across the surface of the integrated circuit can be mapped and compared by measuring the oscillation frequencies of the oscillators formed in those regions.

The oscillators can be implemented using programmable logic resources in embodiments of the invention applied to PLDS. In other embodiments, small, simple oscillators can be placed at various locations on the IC. Small ring oscillators can be formed in scribe lines, for example.

This summary does not define the invention: the invention is defined instead by the claims.

DETAILED DESCRIPTION

Figure 1:
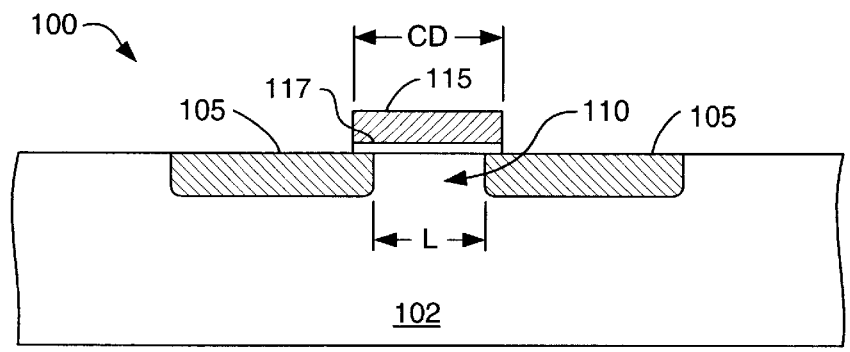
FIG. 1 (prior art) is a cross-section of an MOS transistor 100 formed in the surface of a semiconductor substrate 102.
Figure 2:
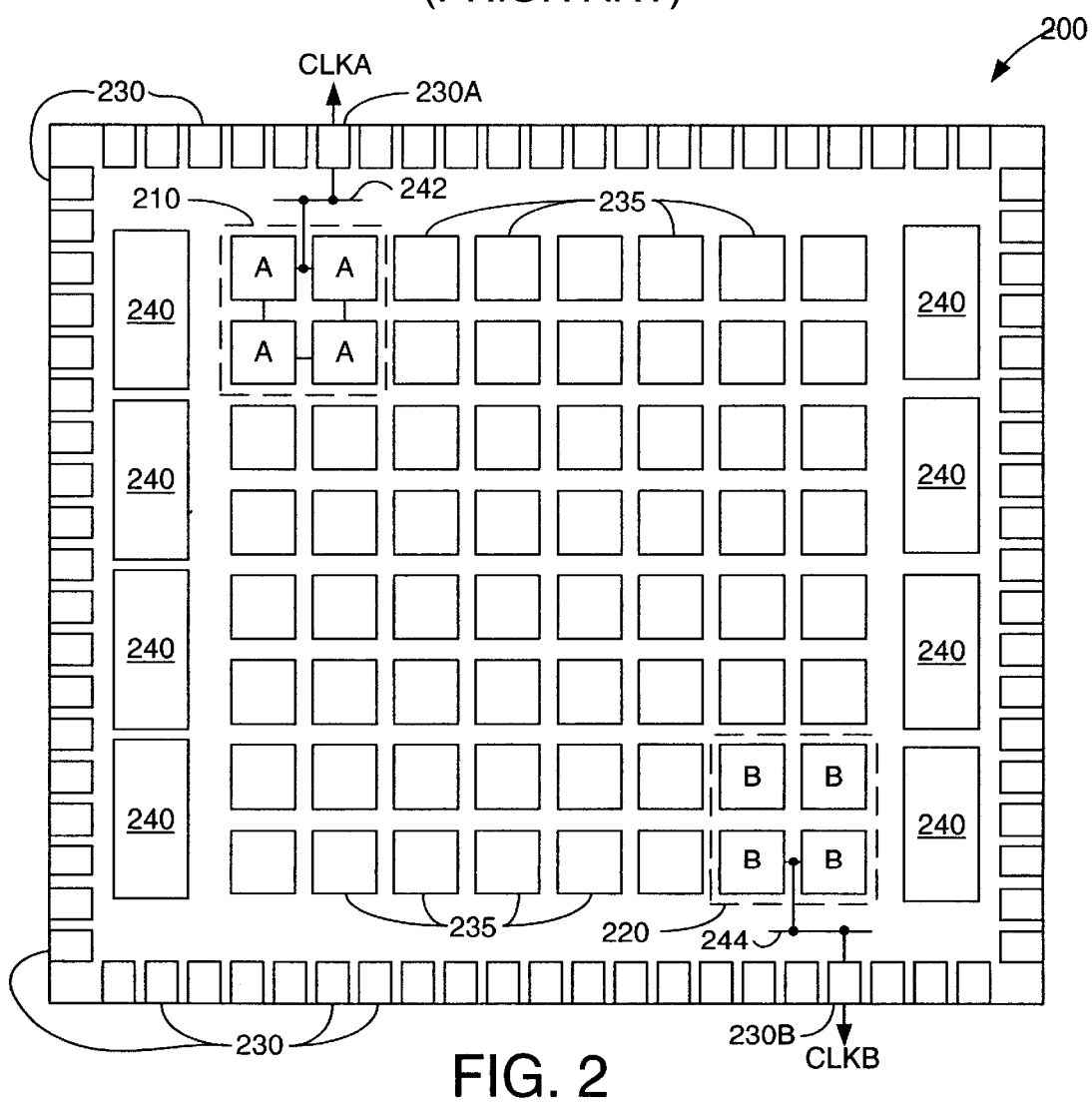
FIG. 2 depicts a field-programmable gate array (FPGA) 200.

FIG. 2 depicts a conventional FPGA 200, which includes a programmable first region 210 and a programmable second region 220. FPGA 200 includes a plurality of IOBs 230, an array of CLBs 235, and a plurality of block RAMs 240. As is conventional, CLBs 235 are the primary building blocks that contain elements for implementing customizable gates, flip-flops, and wiring for connectivity; IOBs 230 provide circuitry for communicating signals with external devices; and block RAMs 240 allow for synchronous or asynchronous data storage, though each CLB can also implement synchronous or asynchronous RAMs. In one embodiment, FPGA 200 is a Virtex™ FPGA available from Xilinx, Inc., of San Jose, Calif. For a more detailed description of a Virtex FPGA for use with the invention, see pages 3—3 to 3-22 of "The Programmable Logic Data Book 1999," also available from Xilinx, Inc.

First region 210 includes four CLBs, each labeled "A," conventionally programmed and interconnected to implement a first oscillator. The "A" CLBs are connected to one another and to an IOB 230A (one of IOBs 230) via some programmable interconnect resources 242. Second region 220 also includes four CLBs, each labeled "B," conventionally programmed and interconnected to implement a second oscillator substantially identical to the first. The "B" CLBs are connected to one another and to an IOB 230B via some programmable interconnect resources 244. In the present example, the remaining "empty" CLBs 235 are unconfigured, though this need not be the case. Further, more or fewer CLBs can be used to implement the first and second oscillators, depending upon the FPGA architecture and the complexity of the selected oscillator.

The first and second oscillators produce respective clock signals CLKA and CLKB on like-named terminals. These signals oscillate at frequencies that depend, in part, on the critical dimension of the CLBs and interconnect resources used to form the respective oscillators. If the critical dimensions are the same in both of regions 210 and 220, then signals CLKA and CLKB should have approximately the same period (i.e., CLKA and CLKB should oscillate at the same frequency). However, differences in critical dimensions between regions 210 and 220 will result in the oscillators in regions 210 and 220 having different oscillation frequencies. Thus, the frequencies of the signals on lines CLKA and CLKB can be compared to identify variations between the critical dimensions of features within regions 210 and 220.

Figure 3:
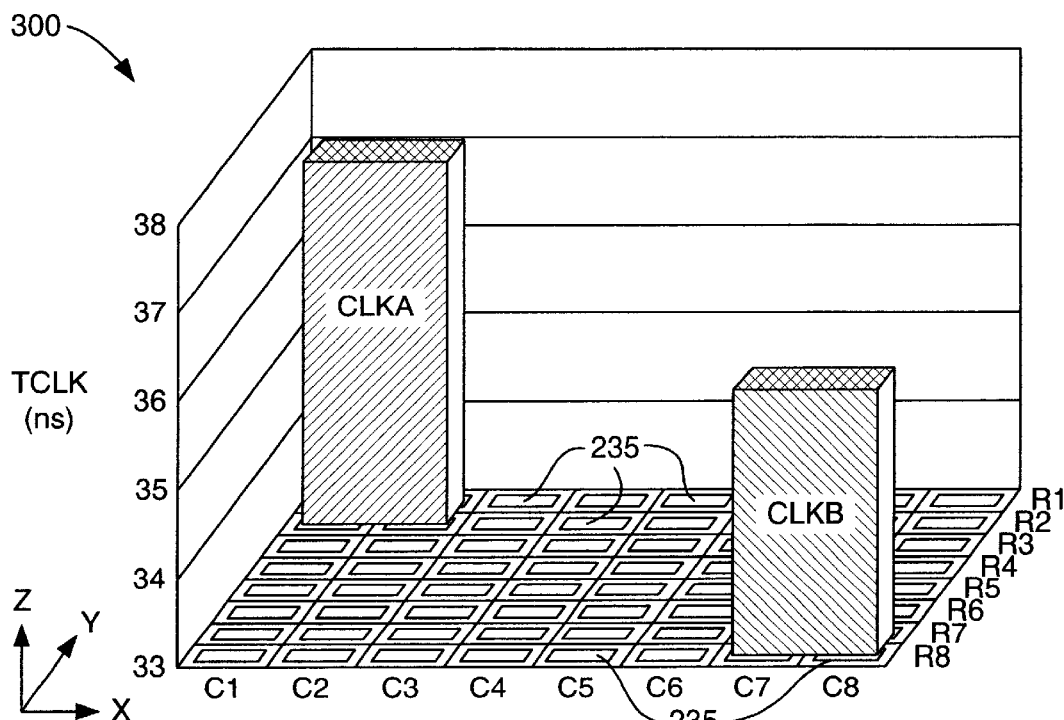
FIG. 3 is a graph 300 depicting the surface of FPGA 200 of FIG. 2 in two horizontal (x and Y) dimensions and the device speed along a vertical (Z) axis.

FIG. 3 is a graph 300 depicting the surface of FPGA 200 of FIG. 2 in two horizontal (X and Y) dimensions and the speed of the first and second oscillators A and B in regions 210 and 220, respectively, along a vertical (Z) axis. Graph 300 correlates the clock periods TCLK of signals CLKA and CLKB with the respective regions 210 and 220. FIG. 300 identifies regions by CLB row (R1–R8) and CLB column (C1–C8). Region 210 includes the CLBs in rows one and two, columns one and two, whereas region 220 includes the CLBs in rows seven and eight, columns seven and eight.

In the example, the signal CLKA from the oscillator in region 210 has a clock period of approximately 37 ns, and the signal CLKB from the oscillator in region 220 has a clock period of approximately 36 ns. The 1 ns difference reflects, in part, a difference in the critical dimensions of circuit features within regions 210 and 220.

Figure 4:
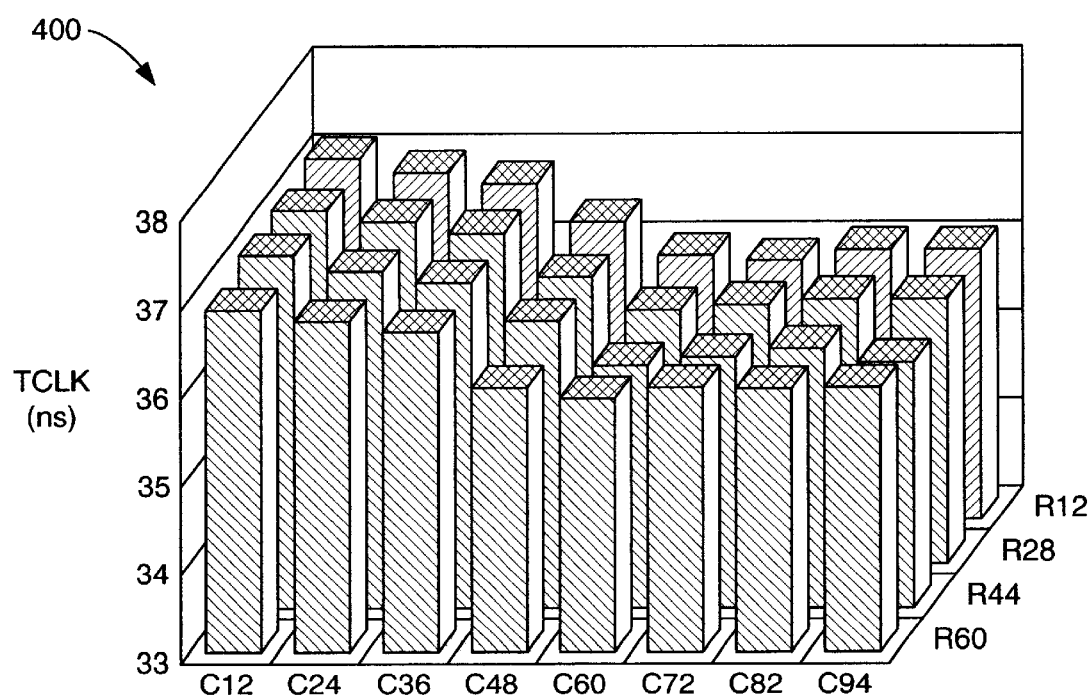
FIG. 4 is a graph 400 similar to graph 300 of FIG. 3, and relates devices formed on the surface of an FPGA with speed performance.

FIG. 4 is a graph 400 similar to graph 300 of FIG. 3, and relates devices formed on the surface of an FPGA with speed performance. Unlike graph 300, however, graph 400 depicts the clock period TCLK for each of thirty-two oscillators formed over the surface of an FPGA that includes a larger array of CLBs. The larger number of oscillators produces a type of "topographical" map of the FPGA, in which the topology is a measure of speed performance. As discussed above, this speed performance can be correlated to the critical dimensions of features within each region of interest. Thus, the topology maps the critical dimensions of features within the various regions of the FPGA.

Figure 5:
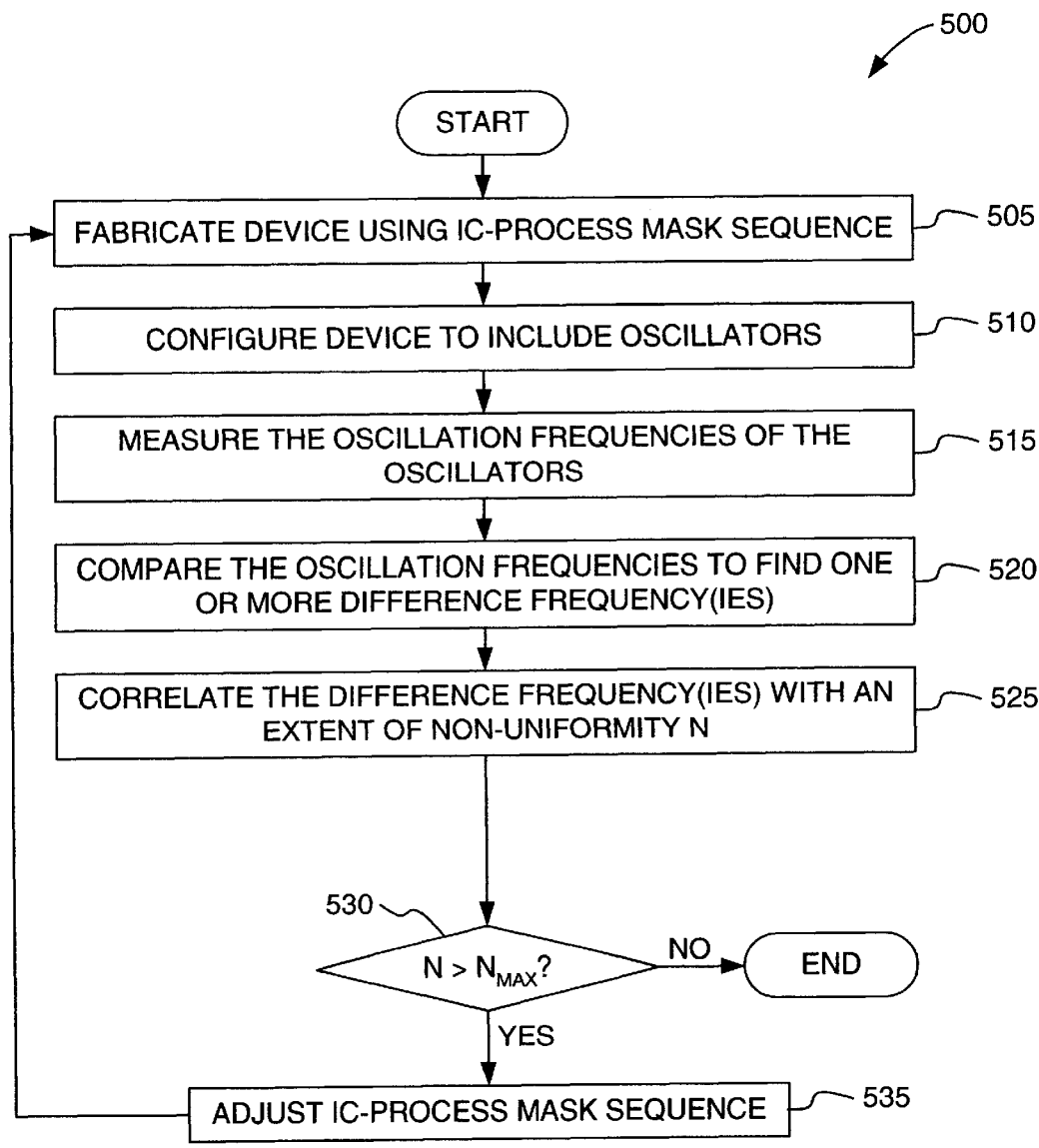
FIG. 5 is a flowchart 500 depicting the process of measuring feature-size uniformity in accordance with an embodiment of the invention.

FIG. 5 is a flowchart 500 depicting the process of measuring critical-dimension uniformity in accordance with an embodiment of the invention. First, an IC is fabricated (step 505) using a conventional semiconductor process sequence. Assuming the IC is a PLD, then the resulting device is configured to include two or more oscillators in specified regions (step 510). Otherwise, the requisite oscillators are formed during step 505 along with other circuit features. The oscillators are then enabled and the oscillation frequencies of the oscillators measured (step 515).

Due to the relationship between oscillation frequency and critical dimensions, frequency differences between the various oscillators indicate potential critical-dimension non-uniformity. Such differences are therefore determined by comparing relevant oscillation frequencies (step 520). Any resulting differences are used to estimate an extent of non-uniformity N (step 525). If the extent of non-uniformity N is greater than some predetermined maximum acceptable non-uniformity value $N_{MAX}$, as determined in step 530, then the process moves to step 535 in which the process sequence used to form the IC is analyzed and adjusted as necessary to improve critical-dimension uniformity. The sequence of FIG. 5 then returns to step 505, hopefully to produce a second IC having improved feature uniformity.

Appropriate adjustments to improve feature uniformity may include correction of mask alignment and/or improved temperature control. In an actual case, the present invention was used to identify non-uniformity problems caused by uneven drying of photoresist layers used to define various circuit features. Correction of the problem improved speed uniformity among an array of oscillators by a factor of about ten.

Figure 6:
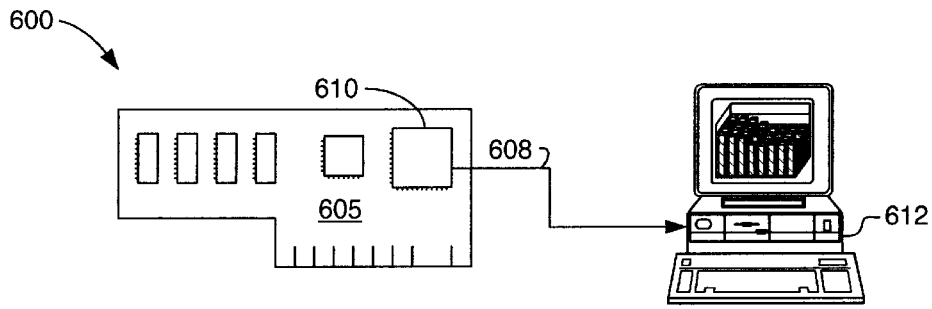
FIG. 6 depicts a system 600 for measuring feature-size uniformity in accordance with an embodiment of the invention.

FIG. 6 depicts a system 600 in accordance with an embodiment of the invention. System 600 includes a conventional PC board 605 upon which is mounted an IC 610, such as FPGA 200 of FIG. 2. IC 610 connects via a bus 608 to an input port of a processor 612, in this case a Windows™-based personal computer. In an embodiment in which IC 610 is a PLD, processor 612 is adapted to configure IC 610 to include a number of oscillators. The process of configuring FPGAs to implement desired circuits is well known. A number of software tools support this process, including the Foundation™ and Alliance™ computer-aided engineering tools available from Xilinx, Inc. These tools support a number of types of FPGAs, including the Virtex™ line of FPGAs made by Xilinx, Inc.

Regardless of the type of IC 610, processor 612 is adapted to measure the speed performance of the various oscillators. This measurement is a relatively simple task, requiring processor 612 to merely count the number of signal transitions for a selected oscillator over a fixed period. Processor 612 may simply display the speed performance for each oscillator; alternatively, processor 612 may correlate differences in speed performance with feature-size variations using formulas derived using empirical data taken from devices created using the same or a similar process. For example, an optical microscope can be used to measure the critical dimensions associated with oscillators having different operating frequencies to establish a relationship between frequency and critical dimension. This relationship can then be used to estimate the critical dimensions of similar oscillators based upon the operating frequency of those oscillators.

The steps employed by processor 612 can be stored on a computer-readable medium. Examples of computer-readable mediums include magnetic and optical storage media and semiconductor memory. The computer system may be a single stand-alone computer, as described here, or may be networked with other computers.

Figure 7:
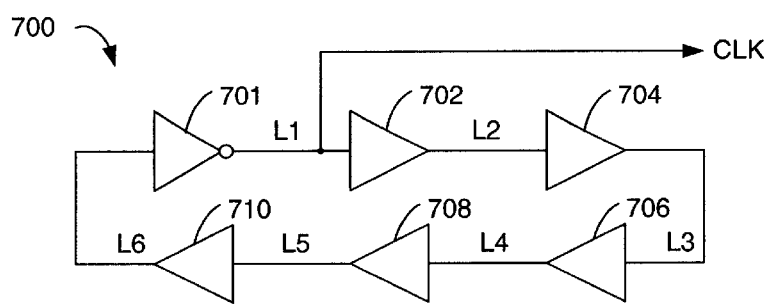
FIG. 7 is a schematic diagram of a conventional ring oscillator 700.

FIG. 7 is a schematic diagram of a conventional ring oscillator 700. Ring oscillator 700 includes an inverter 701 having an output terminal connected via a line L1 to the input terminal of a buffer 702, which in turn has an output terminal connected to an input of a buffer 704 via a line L2. Three additional buffers (706, 708, and 710) are similarly connected via lines L3, L4, and L5, respectively. An output terminal of buffer 710 connected to the input terminal of inverter 701 via a line L6 completes the circuit.

When power is applied to ring oscillator 700, the output terminal of inverter 701 (line L1) provides a clock signal CLK. The oscillation frequency of the signal CLK depends upon the delay associated with inverter 701 and buffers 702, 704, 706, 708, and 710, and upon the delays imposed by lines L1 through L6. Ring oscillators are well known, and may be implemented in many other configurations. For example, a greater or lesser number of buffers may be used, or a different number of inverters may be used.

If the oscillation frequency of the signal CLK is too high, the clock frequency may be overly sensitive to changes in power supply voltage $V_{cc}$. Thus, ring oscillator 700 should be configured such that the clock signal on line CLK has ample time to oscillate between $V_{cc}$ and ground potential.

Oscillator 700, and any of myriad other types of oscillators, can be represented using NeoCad Epic software commercially available from Xilinx, Inc. In such a case, inverter 701 and buffers 702, 704, 706, 708, and 710 can be implemented in separate CLBs; lines L1 through L6 can be implemented using programmable interconnect lines; and output terminal CLK can be routed to processor 612 (FIG. 6) through an IOB. In another embodiment, clock signals are fed to respective counters (not shown) on IC 610, the contents of which can be read for comparison. The process of configuring FPGAs to implement desired circuits is well known.

Oscillator frequencies depend upon a number of variables in addition to critical dimensions. For example, changes in power-supply voltage or operating temperature can also impact oscillator frequency. One embodiment reduces the impact of temperature and voltage fluctuations on oscillation frequency by running only one or a relative few oscillators at once. Reducing the number of active oscillators at any given time minimizes heat generation and power-supply loading. The effect of temperature on frequency can be further reduced by maintaining each IC to be tested at a known temperature, for example in a conventional adiabatic chamber or with a conventional hot probe. Once the temperature of the IC reaches equilibrium, power can be applied and the frequency of the oscillators quickly measured before the operation of the oscillators affects a significant temperature change in the IC. Such measurements are easily done, for measuring the stable frequency of a typical oscillator can be accomplished in less than about one hundred milliseconds.

Figure 8:
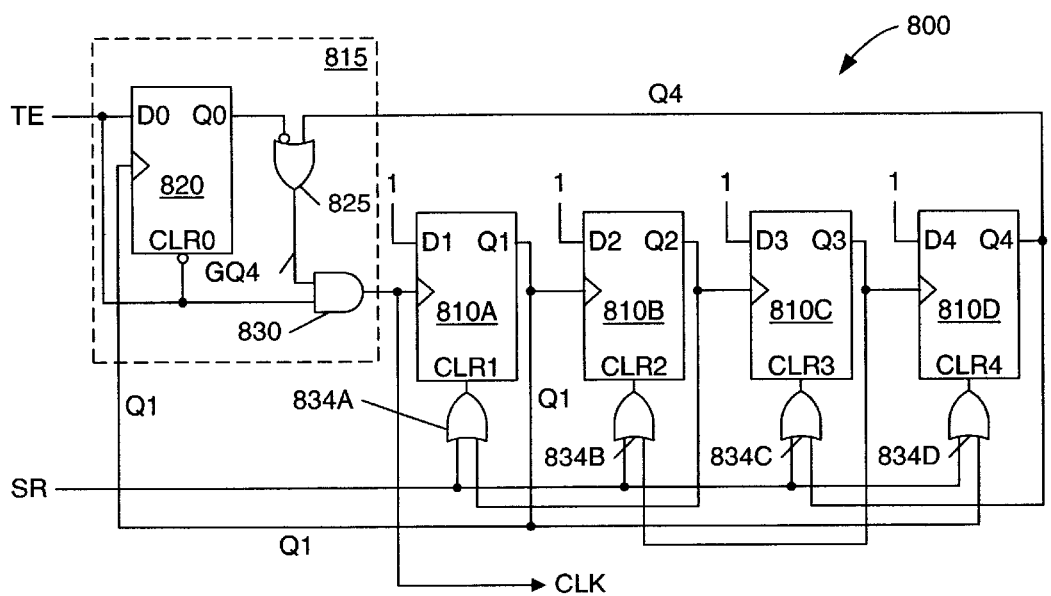
FIG. 8 is a schematic diagram of an oscillator 800 in accordance with another embodiment of the invention.

FIG. 8 is a schematic diagram of an oscillator 800 in accordance with another embodiment. The depicted configuration produces an oscillating test signal having a period including the clock-to-out delays of four synchronous components, flip-flops 810A-810D. Other embodiments include additional signal paths for which the associated signal propagation delays are of interest.

Oscillator 800 includes an oscillator-enable circuit 815 connected to the clock input of flip-flop 810A via a test-clock line CLK. Oscillator-enable circuit 815 in turn includes a flip-flop 820, an OR gate 825, and an AND gate 830. Oscillator-enable circuit 815 produces an edge on clock line CLK when a test-enable signal TE is brought high. Oscillator 800 oscillates in response to the rising edge and continues oscillating until the test-enable signal returns to a logic zero. The duration of the test-enable signal and the number of oscillations that occur while the test-enable signal is asserted are then used to calculate the period of oscillator 800.

A test-enable line TE conveys the test-enable signal to a synchronous input terminal D0 of flip-flop 820, an inverting asynchronous input terminal CLR0 of flip-flop 820, and an input terminal of AND gate 830. For purposes of the present disclosure, input terminals are said to be "synchronous" if they effect a change in a memory element only upon receipt of a clock signal, and are said to be "asynchronous" if they change or effect a change in a memory element independent of a clock signal.

A reset signal SR connects to the clear inputs CLR1-CLR4 of flip-flops 810A-810D via respective OR gates 834A-834D. An output terminal Q0 of flip-flop 820 connects to an input of OR gate 825. The output terminal of OR gate 825 connects to the remaining input terminal of AND gate 830 via a line GQ4. Oscillator-enable circuit 815 also includes a pair of input lines Q1 and Q4 from respective flip-flops 810A and 810D: line Q1 connects to the clock input of flip-flop 820; line Q4 connects to the second input terminal of OR gate 825.

The synchronous "Q" output terminal of each flip-flop 810A–D connects to:

1) an asynchronous clear terminal of a previous flip-flop via a respective OR gate; and
2) the clock terminal—conventionally designated using a ">" symbol—of a subsequent flip-flop. (Note that line Q4 connects to the clock terminal of flip-flop 810A via oscillator-enable circuit 815).

For example, output terminal Q3 of flip-flop 810C connects to both the clock terminal of flip-flop 810D and, through OR gate 834B, the asynchronous clear terminal CLR2 of flip-flop 810B. Each rising edge on any given clock terminal thus propagates through to the subsequent flip-flop; the subsequent flip-flop then clears the preceding flip-flop to prepare the preceding flip-flop for the next rising edge. Each subsequent flip-flop thus acts as a delay element between the output terminal and the clear terminal of the previous flip-flop. Output Q4 from flip-flop 810D is connected, through circuit 815, to the clock input terminal of flip-flop 810A so that flip-flops 810A-D forms a ring oscillator.

For a detailed description of oscillator 800 and a number of other oscillators that may be adapted for use with the present invention, see the following documents, all of which are incorporated herein by reference:

1. U.S. Pat. No. 6,005,829, issued on Dec. 21, 1999, entitled "Method For Characterizing Interconnect Timing Characteristics," by Robert O. Conn, filed May 21, 1998;
2. U.S. Pat. No. 6,233,205, issued on May 15, 2001, entitled "Built-In Self Test Method For Measuring Clock to Out Delays," by Robert W. Wells, Robert D. Patrie, and Robert O. Conn, filed Jul. 14, 1998;
3. U.S. Pat. No. 6,219,305, issued Apr. 17, 2001, entitled "Method and System for Measuring Signal Propagation Delays Using Ring Oscillators," by Robert Wells, and Robert Patrie, et al., filed Jul. 14, 1998; and
4. U.S. Pat. No. 6,069,849, issued May 30, 2000, entitled "Method and System For Measuring Signal Propagation Delays Using the Duty Cycle of a Ring Oscillator," by Christopher H. Kingsley, Robert W. Wells, Robert D. Patrie, and Robert O. Conn, filed Jul. 14, 1998.

Although the present invention has been described in considerable detail with reference to certain preferred versions thereof, other versions are possible. Therefore, the spirit and scope of the appended claims should not be limited to the foregoing description.

What is claimed is:

1. A method for measuring feature-size uniformity across a surface of a programmable logic device, wherein the programmable logic device is configurable using a collection of configurable elements to provide specified logic functions, the method comprising:
   a. configuring a first set of the configurable elements in a first region of the programmable logic device to include a first oscillator, wherein the first oscillator oscillates at a first frequency that depends upon a first device having a first critical dimension;
   b. configuring a second set of the configurable elements in a second region of the programmable logic device to include a second oscillator, wherein the second oscillator oscillates at a second frequency that depends upon a second device having a second critical dimension;
   c. measuring a difference between the first and second frequencies to obtain a frequency difference; and
   d. correlating the frequency difference to an extent of feature-size uniformity, the greater the frequency difference, the less the feature-size uniformity.

2. The method of claim 1, wherein the programmable logic device is manufactured using a sequence of mask steps, the method further comprising adjusting the sequence of mask steps to minimize the difference between the first and second critical dimensions.

3. The method of claim 2, further comprising manufacturing a second programmable logic device using the adjusted sequence of mask steps.

4. The method of claim 3, further comprising measuring feature-size uniformity across a second surface of the second programmable logic device using the method of claim 3.

5. The method of claim 1, wherein the first and second oscillators are ring oscillators.

6. The method of claim 1, wherein the programmable logic device is an FPGA.

7. The method of claim 1, further comprising mapping the first and second regions on the surface of the programmable logic device.

8. The method of claim 7, the mapping further comprising indicating the relative values of the first and second critical dimensions.

9. A method for measuring feature-size uniformity across a surface of an integrated circuit, the method comprising:
   a. forming a first oscillator in a first region and a second oscillator in a second region, wherein the first oscillator oscillates at a first frequency that depends upon a first device having a first critical dimension, and wherein the second oscillator oscillates at a second frequency that depends upon a second device having a second critical dimension;
   b. measuring a difference between the first and second frequencies to obtain a frequency difference; and
   c. correlating the frequency difference to an extent of feature-size uniformity, the greater the frequency difference, the less the feature-size uniformity.

10. The method of claim 9, wherein the integrated circuit is fabricated using a sequence of masks, and wherein the masks define the first and second critical dimensions as equal.

11. The method of claim 10, the method further comprising adjusting the sequence of mask steps to minimize the difference between the first and second critical dimensions.

12. The method of claim 11, further comprising manufacturing a second integrated circuit using the adjusted sequence of mask steps.

13. The method of claim 12, further comprising measuring feature-size uniformity across a second surface of the second integrated circuit using the method of claim 9.

14. The method of claim 9, wherein the first and second oscillators are ring oscillators.

15. The method of claim 9, wherein the integrated circuit is bounded by scribe lines, and wherein the first and second oscillators at least partially overlap the scribe lines.

16. The method of claim 9, further comprising mapping the first and second regions on the surface of the integrated circuit.

17. The method of claim 16, the mapping further comprising indicating the relative values of the first and second critical dimensions.

18. A system for measuring feature-size uniformity across a surface of an integrated circuit, the system comprising:
   a. a first oscillator located in a first region of the integrated circuit, the first oscillator producing a first output signal on a first oscillator output terminal, wherein the first output signal oscillates at a first frequency that depends upon a first critical dimension of devices within the first region;
   b. a second oscillator located in a second region of the integrated circuit, the second oscillator producing a second output signal on a second oscillator output terminal, wherein the second output signal oscillates at a second frequency that depends upon a second critical dimension of devices within the second region; and
   c. a processor having an input port connected to the first and second oscillator output terminals, the processor adapted to derive the first and second critical dimensions using the first and second frequencies.

19. The system of claim 18, the processor being further adapted to display the relative locations of the first and second regions on the surface of the integrated circuit.

20. The system of claim 19, wherein the display of the relative locations of the first and second regions includes indications of the relative values of the first and second critical dimensions.

21. The system of claim 18, wherein the integrated circuit further comprises a counter having a counter input terminal connected to the first oscillator output terminal, and a counter output terminal connected to the input port of the processor, such that the input port of the processor connects to the first oscillator output terminal via the counter.

22. The system of claim 21, wherein the integrated circuit further comprises a second counter having a second counter input terminal connected to the second oscillator output terminal, and a second counter output terminal connected to the input port of the processor, such that the input port of the processor connects to the second oscillator output terminal via the second counter.

23. A computer-readable medium having computer-executable instructions for performing the steps of:
   a. configuring a programmable logic device to include a plurality of oscillators, each oscillator being formed using configurable logic resources in a respective one of a plurality of regions of the programmable logic device;
   b. monitoring an output frequency for each of the plurality of oscillators to obtain a plurality of output frequencies, there being at least one output frequency for each of the plurality of regions of the programmable logic device; and c. correlating the at least one output frequency for each region of the programmable logic device to a critical dimension in each region of the programmable logic device.

24. A method of measuring feature-size uniformity on an integrated circuit, the method comprising:

a. defining a plurality of regions on the surface of the integrated circuit, each of the regions including a plurality of devices;

b. measuring the switching speeds of the devices;

c. correlating the switching speeds of the plurality of devices in a first one of the plurality of regions with a first critical dimension; and d. correlating the switching speeds of the plurality of devices in a second one of the plurality of regions with a second critical dimension.

25. The method of claim 24, further comprising defining a known relationship between switching speed and critical dimension, wherein the step of correlating the switching speeds of the plurality of devices in a first one of the plurality of regions comprises applying the known relationship to the switching speeds of the plurality of devices in the first one of the plurality of regions.

26. The method of claim 24, wherein measuring the switching speeds of the devices comprises configuring the devices as oscillators and measuring at least one of the period or the frequency of the oscillators.

* * * * *